United States Patent [19]

Miyake et al.

[11] Patent Number: 5,045,802
[45] Date of Patent: Sep. 3, 1991

[54] FREQUENCY CHARACTERISTIC SETTING CIRCUITRY FOR AN AMPLIFIER

[75] Inventors: Takashi Miyake; Junichi Fuse; Yoshikatsu Ikata; Shuichi Mori; Hisashi Kihara; Nobuo Utsugi, all of Kawagoe, Japan

[73] Assignee: Pioneer Electronic Corporation, Tokyo, Japan

[21] Appl. No.: 504,180

[22] Filed: Apr. 4, 1990

[30] Foreign Application Priority Data

Apr. 7, 1989 [JP] Japan ................................. 1-88639

[51] Int. Cl.⁵ .............................................. G01R 23/00
[52] U.S. Cl. ........................................ 330/2; 307/522
[58] Field of Search ................... 330/2, 126, 279, 295, 330/302, 304, 306; 307/520, 521, 522; 328/167

[56] References Cited

U.S. PATENT DOCUMENTS 4,510,454  4/1985  Sherman ................... 330/2
4,868,516  9/1989  Henderson et al. ......... 330/2 X Primary Examiner—Steven Mottola
Attorney, Agent, or Firm—Foley & Lardner

[57] ABSTRACT

Frequency characteristic setting circuitry for an amplifier generates frequency band data groups using a plurality of characteristic pattern data groups stored in a memory. Each of the frequency band data groups is made by making each item of data of a characteristic pattern data group retrieved from among a plurality of characteristic pattern data groups stored in the memory correspond to each frequency in a designated frequency band. The data groups generated for a plurality of frequency bands are combined together and the equalizing characteristic of the amplifier is controlled according to a characteristic pattern data group obtained by the combination.

3 Claims, 9 Drawing Sheets

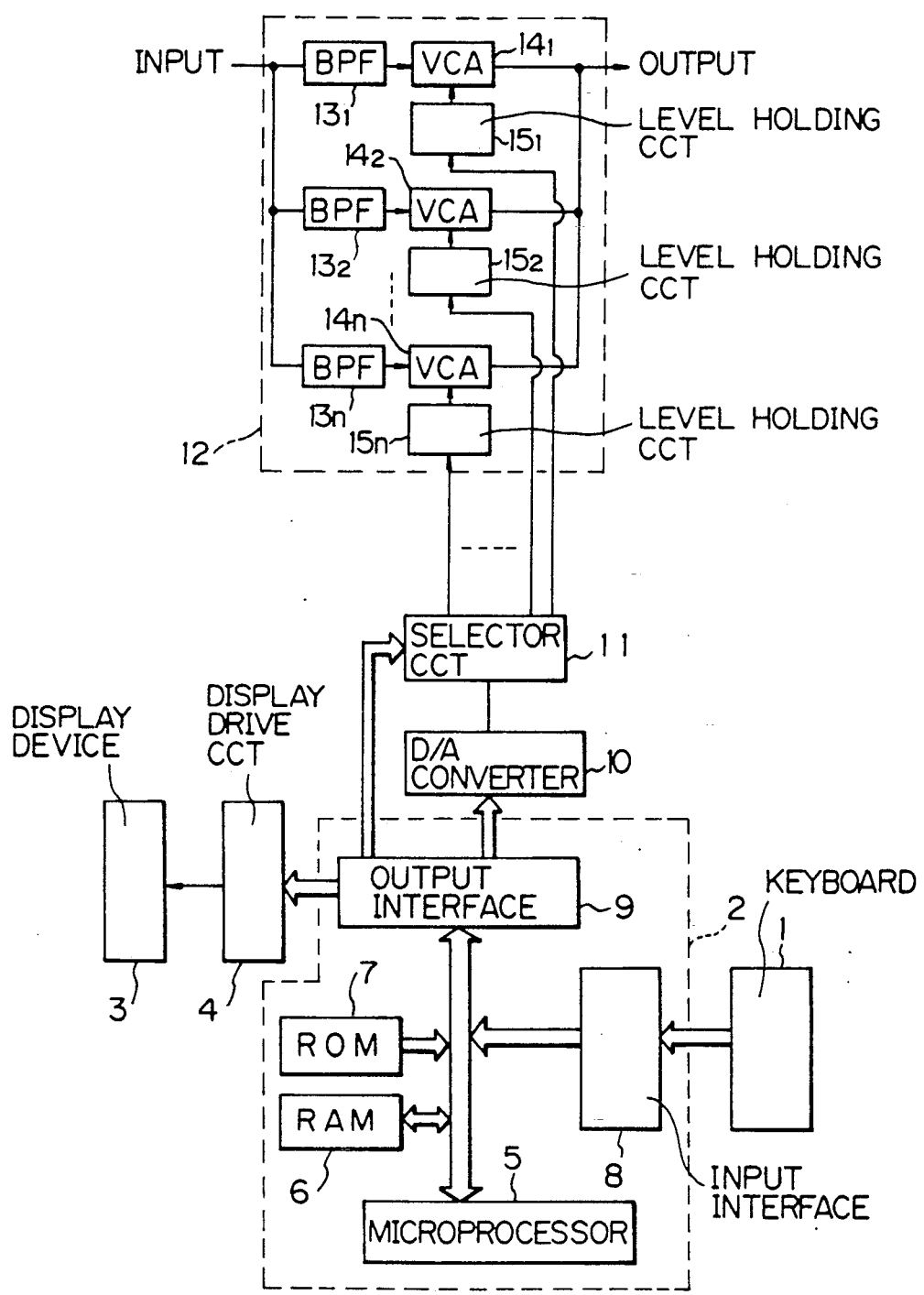

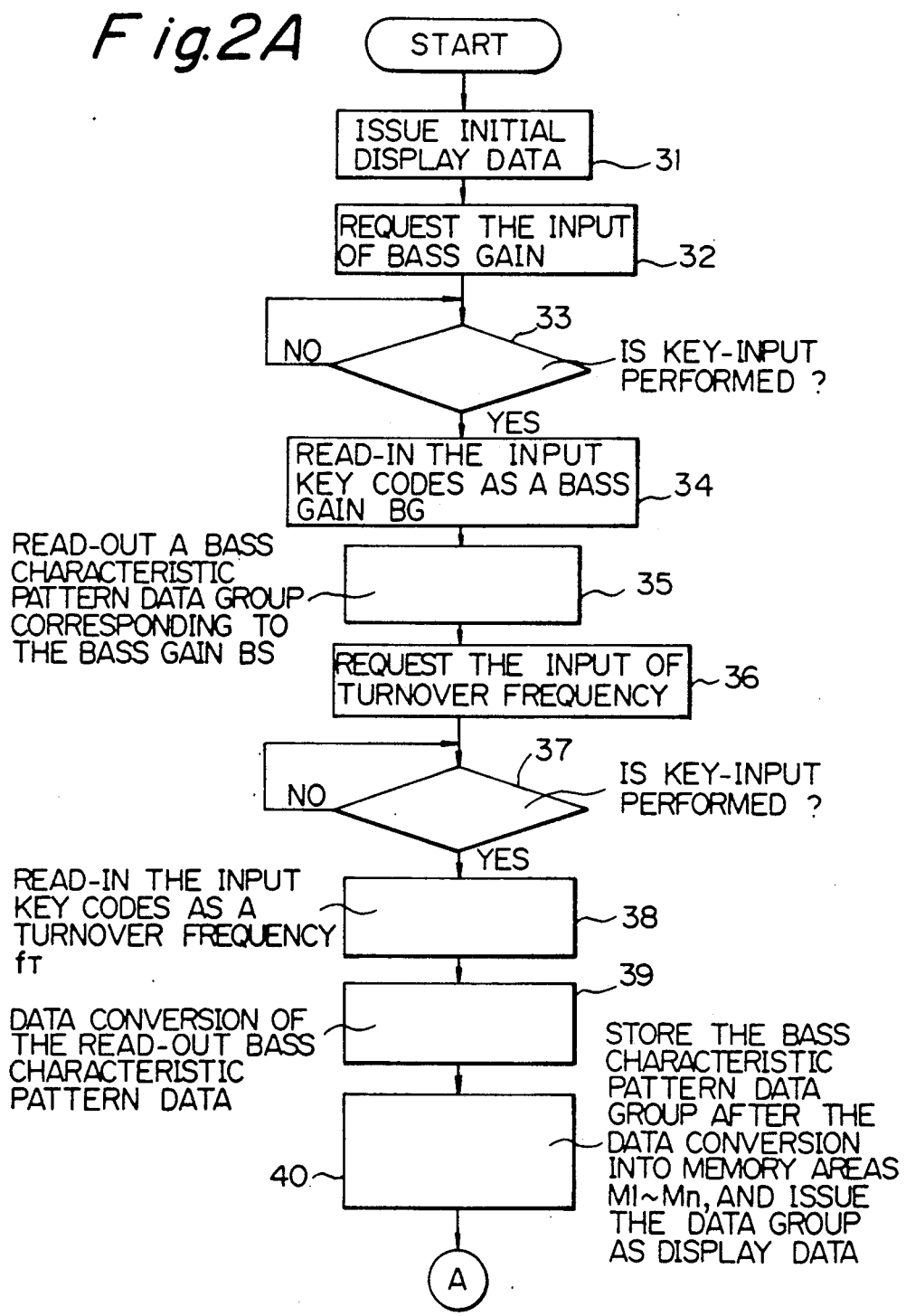

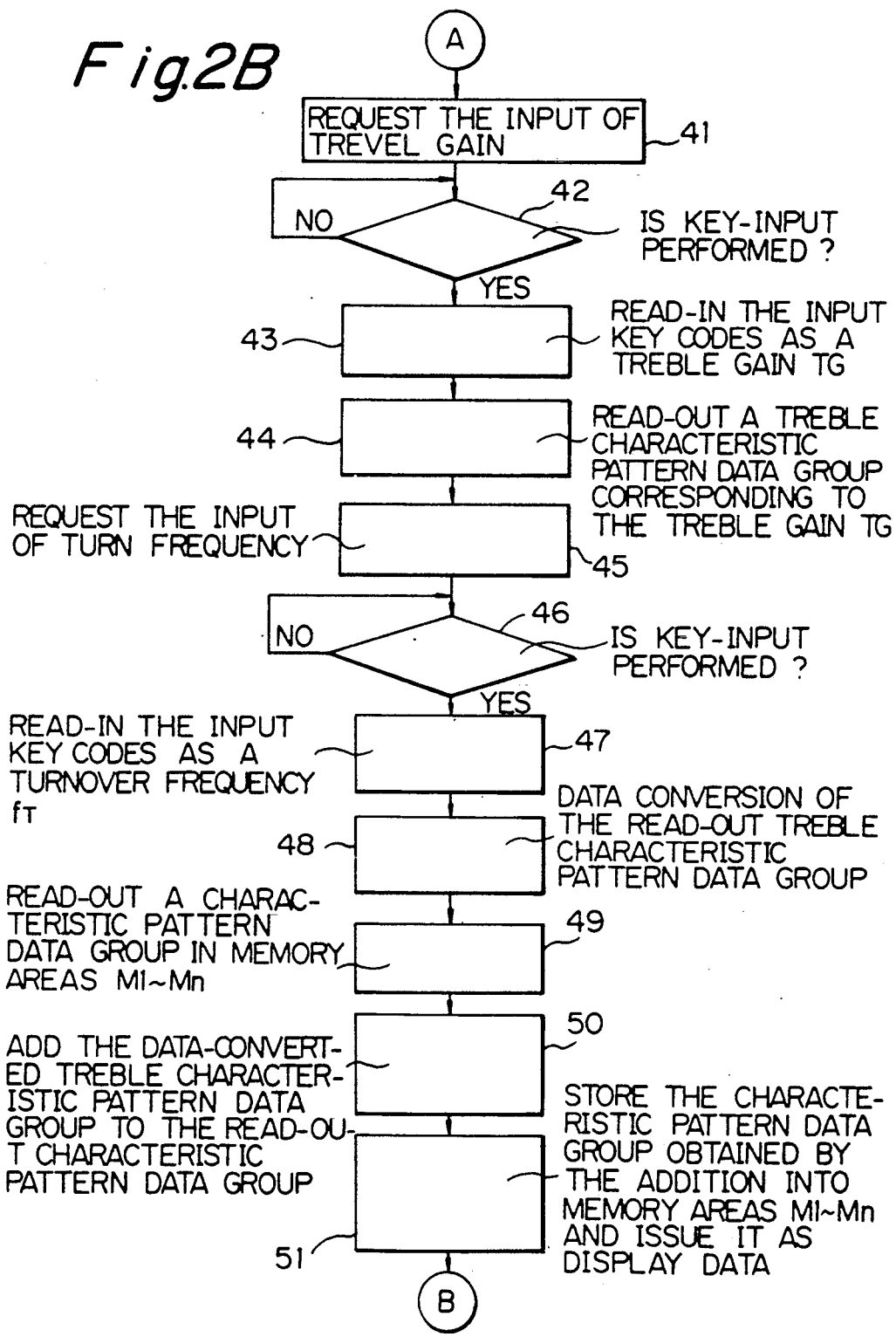

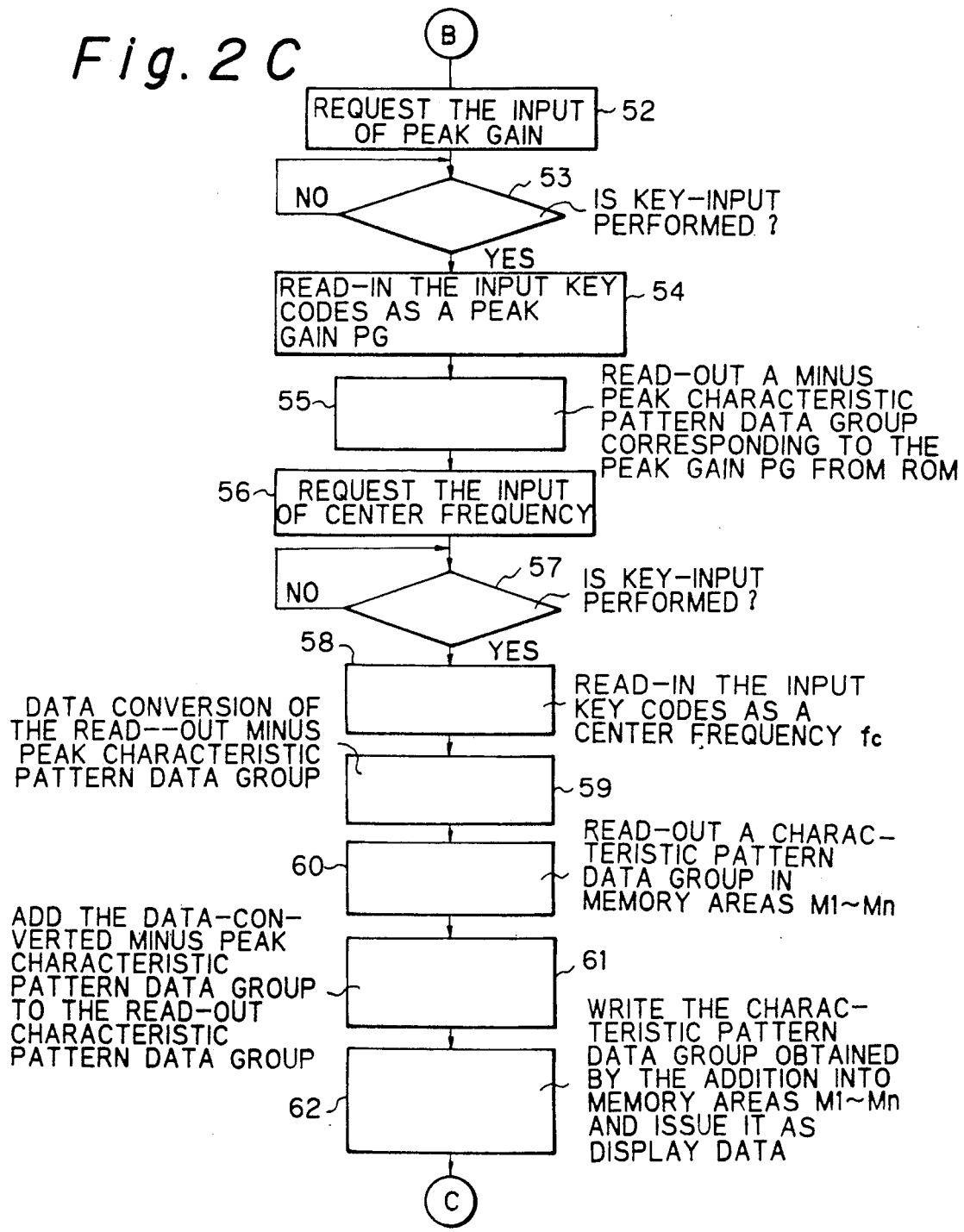

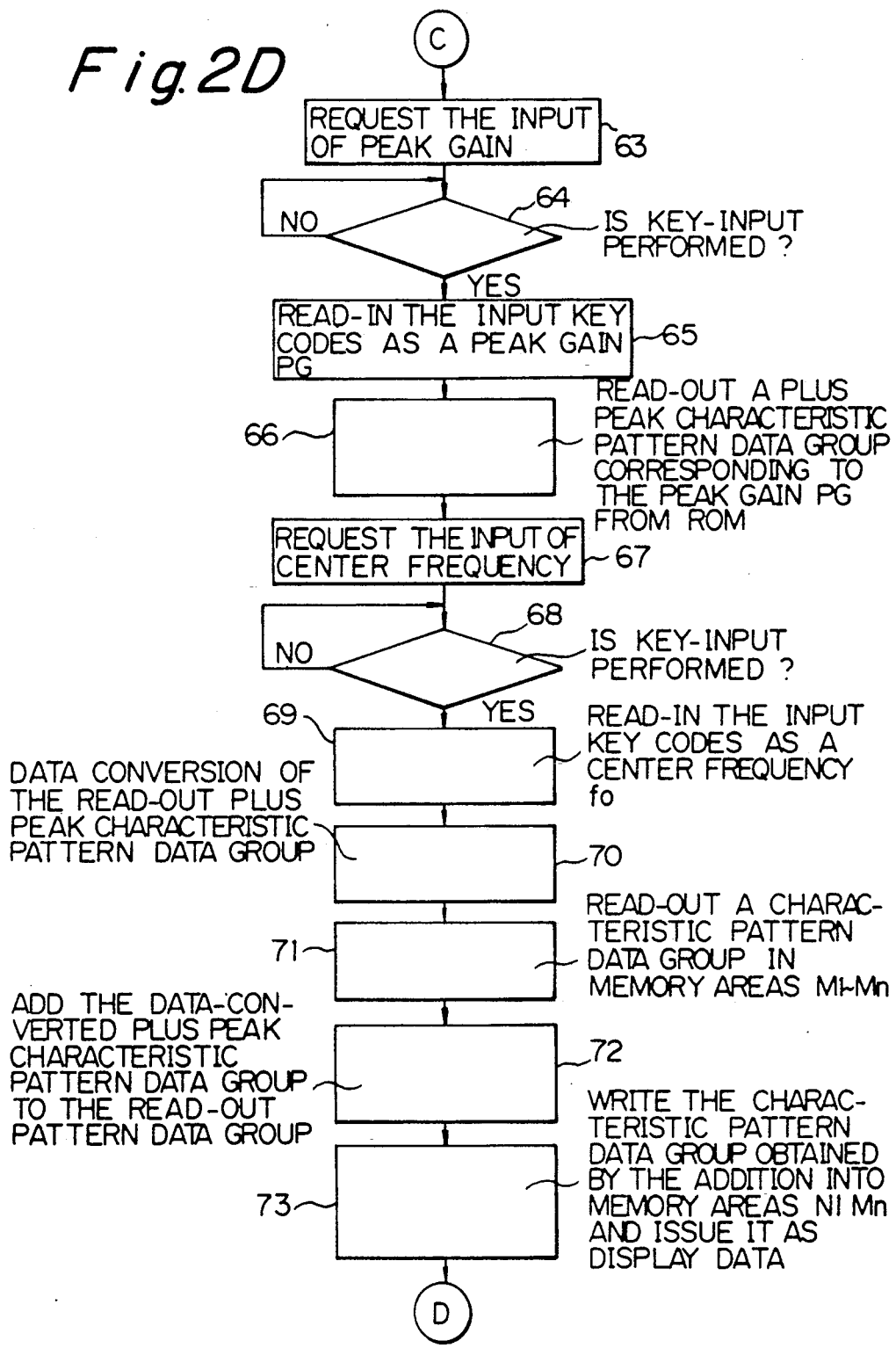

5,045,802

FREQUENCY CHARACTERISTIC SETTING CIRCUITRY FOR AN AMPLIFIER

BACKGROUND OF THE INVENTION

1. Field of the Invention

The present invention relates to frequency characteristic setting of circuitry for arbitrary setting the frequency characteristic of an amplifier.

2. Description of Background Information

Equalizer amplifiers are known as frequency characteristic setting of circuitry for arbitrary setting the frequency characteristic of the amplifier. However, in the case of conventional equalizer amplifiers, it was necessary to divide the audio frequency band into a plurality of frequency bands and to provide a control element for each of such frequency bands in order to enable the setting of complex frequency characteristics. This causes an increase in the number of control elements. If the equalizer amplifier is formed together with other audio equipment such as a tape deck, it becomes difficult to lay out control elements in the operation panel.

OBJECT AND SUMMARY OF THE INVENTION

An object of the present invention is therefore to provide frequency characteristic setting circuitry for an amplifier by which complicated frequency characteristics can be set without the necessity of providing a number of control elements for adjusting the signal level.

According to the present invention, frequency characteristic setting circuitry for an amplifier comprises memory means in which a plurality of characteristic pattern data groups, each of the data groups corresponding to one of a plurality of variations of frequency characteristic, are previously stored, means for designating a characteristics pattern data group among the plurality of characteristic pattern data groups and designating a frequency band, means for retrieving the designated characteristic pattern data group from the memory means, generating means for generating frequency band data by making each item of data of the retrieved characteristic pattern data group correspond to each frequency in the designated frequency band and storing the generated data, combining means for combining data groups generated by the generating means for a plurality of frequency bands, and control means for controlling an equalizing characteristic of the amplifier to a frequency characteristic corresponding to a characteristic pattern data group obtained by the combining means.

BRIEF DESCRIPTION OF THE DRAWINGS

FIG. 1 is a block diagram showing an embodiment of the present invention;.

FIG. 2A is the microprocessor flowchart for the bass gain characteristic setting procedure.

FIG. 2B is the microprocessor flowchart for the treble gain characteristic setting procedure.

FIG. 2C is the microprocessor flowchart for the minus peak characteristic setting procedure.

FIG. 2D is the microprocessor flowchart for the plus peak characteristic setting procedure.

DETAILED DESCRIPTION OF THE PREFERRED EMBODIMENT

Figure 2E:
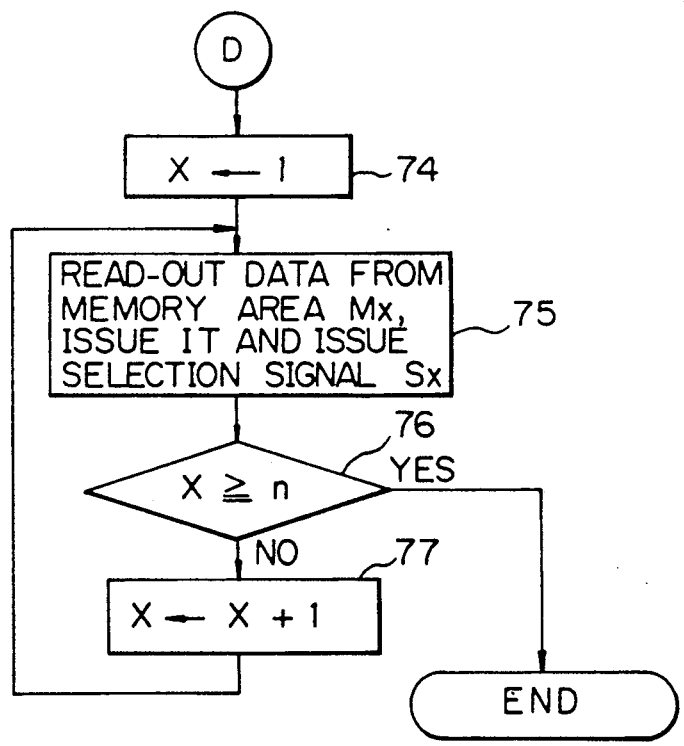
FIG. 2E is the microprocessor flowchart for the final characteristic setting procedure.

The embodiment of the present invention will be explained with reference to the accompanying drawings.

FIG. 1 shows the frequency characteristic setting circuitry according to the present invention. The circuitry includes a keyboard 1, a control circuit 2, a display device 3, and a display drive circuit 4. The control circuit 2 consists of a microcomputer which comprises a microprocessor 5, a RAM 6, a ROM 7, an input interface 8, an output interface 9, and a clock generator (not shown). The microprocessor 5, RAM 6, ROM 7, input interface 8, and output interface 9 are mutually connected via a bus. The keyboard 1 has a plurality of character keys and a plurality of digit keys for generating a selection command, and is connected to the input interface 8. When one of the keys on the keyboard 1 is operated, data indicating the operated key is supplied, as input data, to the microprocessor 5 through the input interface 8. The display device 3 comprises a dot-matrix display, and is driven by the display drive circuit 4. The display drive circuit 4 includes a memory having memory locations each corresponding to each dot of the display device 3. If the content of one memory location is at a level representing a logical "1", a dot corresponding to that memory location is driven, and the driving of the dot corresponding to the memory location is stopped if the content of the memory location is at a level representing a logical "0". The content of each memory location is renewed by display data supplied from the microprocessor 5 through the output interface 9.

In addition to programs to be executed by the microprocessor 5, a plurality of data groups for each of the following data groups are previously stored in the ROM 7, as characteristic pattern data groups. The data groups are, namely, bass characteristic pattern data groups, treble characteristic pattern data groups, plus peak characteristic pattern data groups, and minus peak characteristic pattern data groups.

To the output interface 9, an equalizer amplifier 12 of the amplifier is connected through an D/A converter 10 and a selector circuit 11. The equalizer amplifier 12 consists of a plurality of BPFs (Band Pass Filters) $13_1$ through $13_n$ having different pass-bands, a plurality of VCAs $14_1$ through $14_n$ respectively connected to output terminals of the BPFs $13_1$ through $13_n$, and a plurality of level holding circuit $15_1$ through $15_n$ provided for each of the VCAs $14_1$ through $14_n$ for holding a control signal supplied to the corresponding one of the VCAs $14_1$ through $14_n$. With this structure, the frequency characteristic is determined by varying gains of the plurality of VCAs $14_1$ through $14_n$. In accordance with a command from the microprocessor 5, the selector circuit 11 supplies the output signal of the D/A converter 10 to one of the level holding circuit $15_1$ through $15_n$. In addition, the number n is equal to the number of the data in one characteristic pattern data group obtained by the combination.

In the structure described above, the microprocessor 5 starts a characteristic setting operation when a characteristic setting start key on the keyboard 1 (not shown) is operated.

Figure 3A:
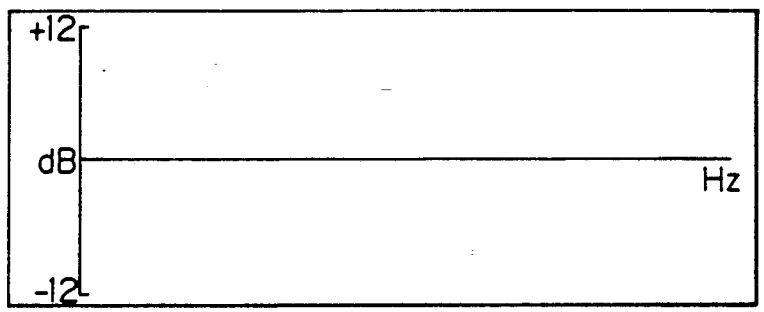
FIG. 3A shows the initial state display.
Figure 3B:
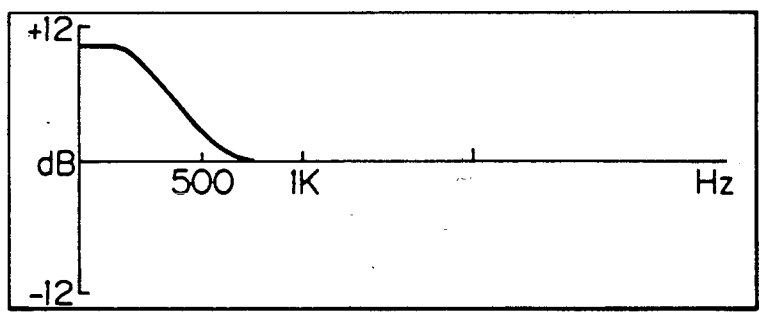
FIG. 3B shows the bass display.
Figure 4A:
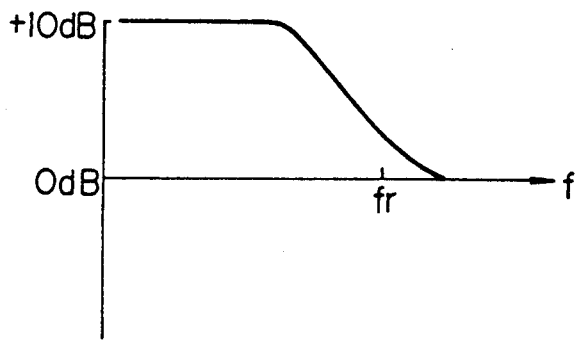
FIG. 4A shows the bass characteristic pattern read-out from the ROM.

In the characteristic setting operation, the microprocessor 5 at first supplies initial display data to the display drive circuit 4 through the output interface 9 (step 31) in order to set the display of the display device 3 to a characteristic setting initial state, as illustrated in FIG. 2. By this operation, an initial state which consists only of the X and Y-axes and the level display is displayed on the display device 3 as illustrated in FIG. 3A. Then the operation proceeds to a bass characteristic setting procedure, in which the microprocessor 5 at first requests the input of the bass gain (step 32), and judges whether or not a key-input is performed (step 33). The request of the bass-gain input is performed, for example, by displaying a message "enter bass gain" at a suitable position of the display device 3. When the key-input is performed, the input key codes are read as a bass gain BG (step 34), and a bass characteristic pattern data group corresponding to the input bass gain is read out from the ROM 7 (step 35). Then, the microprocessor requests the input of a turnover frequency (step 36), and judges whether or not the key-input is performed (step 37). As in the case of the request of the bass-gain input as described above, the request of the input of turnover frequency is performed by displaying a message such as "enter turnover frequency" at a suitable position in the display area of the display device 3. When the key-input is performed, the microprocessor 5 reads-in the input key codes as a turnover frequency $f_T$ (step 38), and performs a data conversion (step 39) in order to make the turnover frequency of the read-out bass characteristic pattern data group equal to the read turnover frequency. More specifically, the turnover frequency of the read-out bass characteristic pattern data group is set at 1 KHz for example, and the bass characteristic as a whole is shifted in frequency so that its turnover frequency equals the turnover frequency $f_T$ of 500 Hz, for example. After the data conversion, the microprocessor 5 writes the bass characteristic pattern data group into memory areas $M_1$ through $M_n$ of the RAM 6 according to the correspondence of the frequency. At the same time, the microprocessor 5 supplies the bass characteristic pattern data group, as display data, to the display drive circuit 4 through the output interface 9 (step 40) in order to display the data group on the display device 3. Therefore, as shown in FIG. 4A, when characteristic pattern data of a bass characteristic having a bass gain BG of 10 dB is read-out by the key-input, a bass characteristic whose turnover frequency is set at 500 Hz is displayed at the display device 3 as shown in FIG. 3B.

Figure 3C:
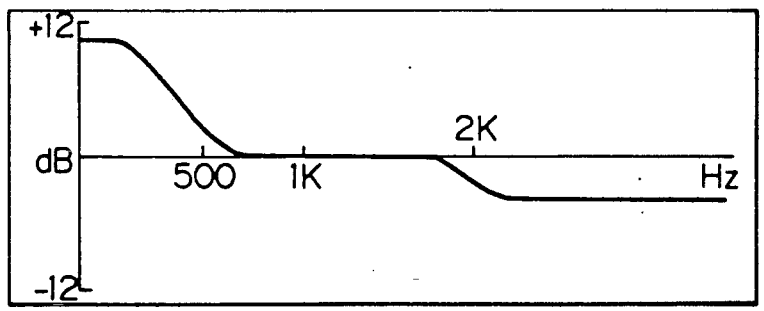
FIG. 3C shows the bass and treble display.
Figure 4B:
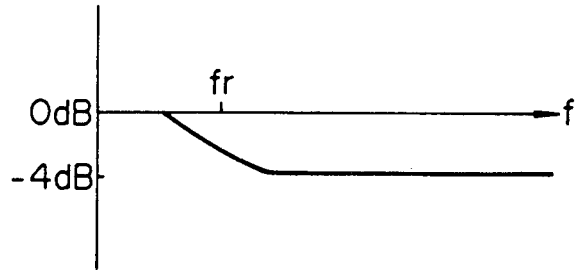
FIG. 4B shows the treble characteristic pattern read-out from the ROM.

Then, the operation proceeds to a treble characteristic setting procedure which is performed in a similar manner as the operational steps 32 through 40 of the bass characteristic setting procedure. As shown in FIG. 2B, the microprocessor at first requests the input of the treble gain (step 41), and judges whether or not the key-input is performed (step 42). When the key-input is performed, the microprocessor reads-in the input key codes as a treble gain TG (step 43). At the same time, the microprocessor 5 reads-out a treble characteristic pattern data group corresponding to the input treble gain TG from the ROM 7 (step 44). Subsequently, the microprocessor requests the input of the turnover frequency (step 45), and judges whether or not the key-input is performed (step 46). If the key input is performed, the microprocessor reads-in the input key codes as a turnover frequency $f_T$ (step 47), and performs a data conversion so that the turnover frequency of the read-out treble characteristic pattern data group equals the read-out turnover frequency $f_T$ (step 48). More specifically, the turnover frequency of the read-out treble characteristic pattern data group is 1 KHz for example, and the treble characteristic as a whole is shifted in frequency so that the its turnover frequency equals the turnover frequency $f_T$ of 2 KHz, for example. After the data conversion, a characteristic pattern data group stored in memory areas $M_1$ through $M_n$ of the RAM 6 is read-out (step 49), and the treble characteristic pattern data group after the data conversion is added to the read-out characteristic pattern data group maintaining the correspondence of frequency (step 50). The characteristic pattern data group obtained by the addition is written into the memory areas $M_1$ through $M_n$ of the RAM 6 according to the correspondence of frequency, and also is supplied to the display drive circuit 4 through the output interface 9 (step 51) in order that the characteristic pattern is displayed on the display device 3. Therefore, when characteristic pattern data whose treble gain TG is $-4$ dB is read-out by the key operation as shown in FIG. 4B, a treble characteristic obtained by setting the treble gain TG at $-4$ dB and setting the turnover frequency $f_T$ at 2 KHz is displayed on the display device 3 in addition to the bass characteristic, as shown in FIG. 3C.

Figure 3D:
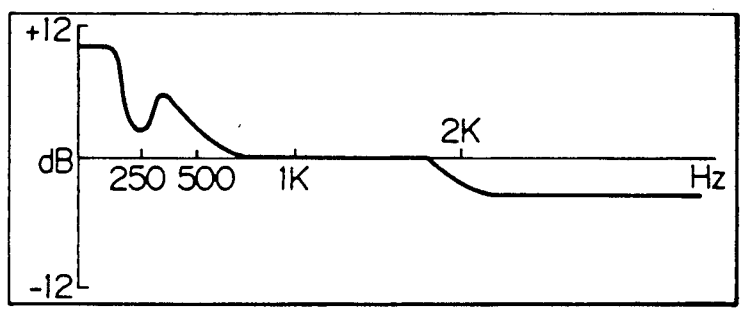
FIG. 3D shows the bass, treble and minus peak display.
Figure 4C:
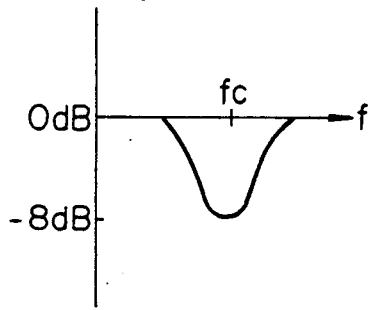
FIG. 4C shows the minus peak characteristic pattern read-out from the ROM.

Then, the operation proceeds to a minus peak characteristic setting procedure. As shown in FIG. 2C, the microprocessor 5 at first requests the input of the peak gain (step 52), and judges whether or not a key-input is performed (step 53). When the key-input is performed, the microprocessor 5 reads-in the input key codes as a peak gain PG (step 54), and reads-out a minus peak characteristic pattern data group corresponding to the input peak gain PG from the ROM 7 (step 55). Then, the microprocessor 5 requests the input of a center frequency (step 56), and judges whether or not a key-input is performed (step 57). If the key-input is performed, the microprocessor 5 reads-in the input key codes as a center frequency fc (step 58), and performs a data conversion so that the center frequency of the read-out minus peak characteristic pattern data group coincides with the read center frequency fc (step 59). More specifically, the center frequency of the read-out minus peak characteristic pattern data group is at 1 KHz for example, and the minus peak characteristic as a whole is shifted in frequency so that its center frequency equals the center frequency fc of 250 Hz, for example. After the data conversion, the microprocessor 5 reads-out the characteristic pattern data group stored in the memory areas $M_1$ through $M_n$ of the RAM 6 (step 60). The minus peak pattern data group after the data conversion is added to the read-out characteristic pattern data group according to the correspondence of frequency (step 61), and the characteristic pattern data group obtained by the addition is written into the memory areas $M_1$ through $M_n$ of the RAM 6 according to the correspondence of frequency, and also is supplied, as the display data, to the display drive circuit 4 through the output interface 9 (step 62) so that the characteristic pattern is displayed on the display device 3. Therefore, when characteristic pattern data of a minus peak characteristic whose peak gain is −8 dB is read-out in response to the key-input as shown in FIG. 4C, a minus peak characteristic having a peak gain of −2 dB, and a center frequency of 250 Hz is displayed on the display device 3 in addition to the bass and treble characteristics, as shown in FIG. 3D.

Figure 3E:
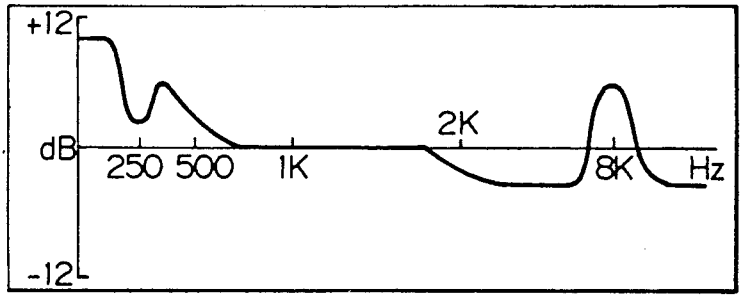
FIG. 3E shows the bass, treble, minus peak and plus peak display.
Figure 4D:
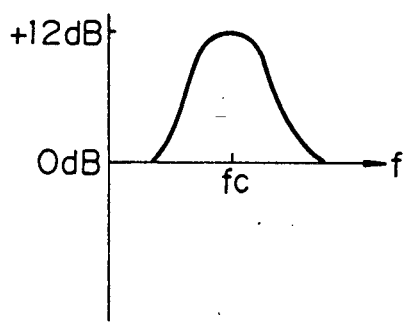
FIG. 4D shows the plus peak characteristic pattern read-out from the ROM.

Then, the operation proceeds to a plus peak characteristic setting procedure. As shown in FIG. 2D, the microprocessor 5 at first requests the input of the peak gain (step 63), and judges whether or not the key-input is performed (step 64). If the key-input is performed, the microprocessor reads-in the input key codes as a peak gain (step 65), and reads-out a plus peak characteristic pattern data group corresponding to the input peak gain from the ROM 7 (step 65). Then, the microprocessor 5 requests the input of center frequency (step 67), and judges whether or not the key-input is performed (step 68). If the key-input is performed, the microprocessor 5 reads-in the input key codes as a center frequency fc (step 69), and performs a data conversion (step 70) in order to make the center frequency in the read-out plus peak characteristic pattern data group coincident with the read center frequency fc. More specifically, the center frequency in the read-out plus peak pattern data group is 1 KHz for example, and the plus peak characteristic as a whole is shifted in frequency so that its center frequency equals 8 KHz, for example. After the data conversion, the microprocessor 5 reads-out the characteristic pattern data group stored in the memory areas $M_1$ through $M_n$ of the RAM 6 (step 71), and adds the plus peak pattern data group after the data conversion to the read-out characteristic pattern data group while maintaining the correspondence of frequency (step 72). The microprocessor 5 writes the added data group into the memory areas $M_1$ through $M_n$ of the RAM 6 according to the correspondence of frequency and also supplies it to the display drive circuit 4 through the output interface 9 as the display data (step 73) in order that the characteristic pattern is displayed on the display device 3. Therefore, when characteristic pattern data of a plus peak characteristic having a peak gain of 12 dB is read-out in response to the key-input as shown in FIG. 4D, a plus peak characteristic having the peak gain of 10 dB and the center frequency of 8 KHz is displayed on the display device 3 in addition to the bass characteristic, treble characteristic, and the minus peak characteristic, as illustrated in FIG. 3E.

After storing the characteristic pattern data group into the memory areas $M_1$ through $M_n$ of the RAM 6, as shown in FIG. 2E the microprocessor 5 makes a variable X equal to 1 (step 74), and reads-out the data of the stored characteristic pattern data group from the memory area $M_X$. The microprocessor 5 supplies the read-out data to the D/A converter 10 through the output interface 9, and supplies a selection signal $S_X$ to the selector circuit 11 (step 75). By these operations, the data in the memory area $M_1$ of the RAM 6 is read-out and supplied to the D/A converter 10. In response to the selection signal $S_1$, the selector circuit 11 supplies the D/A conversion voltage from the D/A converter 10 to the level holding circuit $15_1$. The level holding circuit $15_1$ holds the D/A conversion voltage and supplies it as the control voltage to the VCA $14_1$ so that the gain of the VCA $14_1$ is determined. After the execution of the step 75, the microprocessor 75 judges whether or not the variable X is equal to or greater than n (step 76). If $X<n$, the microprocessor 5 adds a 1 to the variable X, and proceeds to the step 75. If $X>1$, the characteristic setting operation is completed. Through the operations described above, voltages obtained by the D/A conversion of each data of the characteristic pattern data group stored in the memory areas $M_1$ through $M_n$ of the RAM 6 are held in the level holding circuits $15_1$ through $15_n$, and each voltage is used as the control voltage to set the gain of each of the VCAs $14_1$ through $14_n$. The frequency characteristic of the equalizer amplifier 12 is set in this way.

In the embodiment described in the foregoing, the circuitry is configured so that one characteristic pattern data group is designated from each of the bass characteristic pattern data groups, treble characteristic pattern data groups, plus peak characteristic pattern data groups, and minus peak characteristic pattern data groups. However, this is not limitative and the circuitry may be arranged that one characteristic pattern data group is designated respectively only from the bass characteristic pattern data groups and the treble characteristic pattern data groups. It is also possible to designate, for example, two plus peak pattern data groups.

In addition, the circuitry may be arranged such that previously stored characteristic pattern data groups are displayed on the display device 3, and desired characteristic pattern data groups are designated from the displayed characteristic pattern data groups by using the key board, for example.

Furthermore, in the embodiment described in the foregoing, the designation of the characteristic pattern data group from the previously stored characteristic pattern data groups and the designation of the frequency band by using the turn-over frequency and the center frequency are performed through the operations of the keyboard by the user. However, it is also possible to arrange the circuitry such that the designation of the characteristic pattern data group from the stored characteristic pattern data group is automatically performed in response to the tuning operation in the tuner, or on the basis of the music piece to be played by the CD player or the tape deck.

As described in the foregoing, the frequency characteristic setting circuitry for an amplifier according to the present invention is configured so that a characteristic pattern data group and a frequency band are designated from a plurality of characteristic pattern data groups previously stored in memory means, the designated characteristic pattern data is read-out from the memory means, a frequency band data group is generated by making each item of data in the read-out characteristic pattern data group correspond to each frequency in the designated frequency band and the generated frequency band data group is stored, data groups each generated for each of frequency bands are combined with each other, and an equalizing characteristic of the amplifier is controlled at a frequency characteristic corresponding to the characteristic pattern data group obtained by combining the data groups. Therefore, according to the present invention, it is unnecessary to provide control elements for the level control operations, and complex frequency characteristics can be set by means of control elements for only selection operations, such as numeric keys.

Furthermore, if the circuitry is built in audio equipment, the control element for designating the characteristic pattern data group and the frequency band can be used commonly as control elements of the audio equipment. Especially, in this case it is unnecessary to provide the control elements only for setting the frequency characteristic. Thus, the lay-out of control elements in the control panel of the audio equipment is facilitated.

Moreover, if the frequency characteristic is to be displayed on the display device in the form of a curved line in order that the user can confirm the frequency characteristic being set, calculation for displaying the curve is unnecessary and the characteristic curve can be displayed immediately with the circuitry according to the present invention.

What is claimed is:

1. A frequency characteristic setting circuitry for an amplifier comprising:
    memory means in which a plurality of characteristic pattern data groups, each of said data groups corresponding to one of a plurality of variations of frequency response characteristics, are previously stored;
    means for designating a characteristic pattern data group among said plurality of characteristic pattern data groups and for designating a frequency band;
    means for retrieving a designated characteristic pattern data group from said memory means;
    generating means for generating frequency band data by making each data of a retrieved characteristic pattern data group correspond to each frequency in a designated frequency band and for storing generated data;
    combining means for combining data groups generated by said generating means for a plurality of frequency bands; and
    control means for controlling an equalizing characteristic of said amplifier at a frequency characteristic corresponding to a characteristic pattern data group obtained by said combining means.

2. The frequency characteristic setting circuitry of claim 1, wherein bass characteristic pattern data groups, treble characteristic pattern data groups, plus peak characteristic pattern data groups, and minus peak characteristic pattern data groups are previously stored in said memory means.

3. The frequency characteristic setting circuitry of claim 1, further comprising:
    display means for displaying said frequency characteristic corresponding to said characteristic pattern data group obtained by said combining means.

* * * * *